(12) United States Patent
Lee

(10) Patent No.: US 9,570,636 B2
(45) Date of Patent: Feb. 14, 2017

(54) SOLAR CELL AND METHOD OF FABRICATING THE SAME

(71) Applicant: LG INNOTEK CO., LTD., Seoul (KR)

(72) Inventor: Jin Woo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/367,080

(22) PCT Filed: Dec. 13, 2012

(86) PCT No.: PCT/KR2012/010869
§ 371 (c)(1),
(2) Date: Jun. 19, 2014

(87) PCT Pub. No.: WO2013/094936
PCT Pub. Date: Jun. 27, 2013

(65) Prior Publication Data
US 2014/0366942 A1    Dec. 18, 2014

(30) Foreign Application Priority Data

Dec. 19, 2011 (KR) .................. 10-2011-0137804

(51) Int. Cl.
*H01L 31/00* (2006.01)
*H01L 31/0224* (2006.01)
(Continued)

(52) U.S. Cl.
CPC . *H01L 31/022425* (2013.01); *H01L 31/02167* (2013.01); *H01L 31/022483* (2013.01);
(Continued)

(58) Field of Classification Search
CPC .............. H01L 31/0322; H01L 31/022425; H01L 31/18; H01L 31/03923; H01L 31/03926; H01L 31/02167; H01L 31/022483; H01L 31/01884
See application file for complete search history.

(56) References Cited

U.S. PATENT DOCUMENTS 6,310,281 B1 * 10/2001 Wendt ................ H01L 31/0392
136/244
2005/0253142 A1 * 11/2005 Negami et al. .................. 257/65
(Continued)

FOREIGN PATENT DOCUMENTS

| JP | 2005-191167 A | 7/2005 |
|---|---|---|
| JP | 2007-528600 A | 10/2007 |
| KR | 10-2011-0035771 A | 4/2011 |

OTHER PUBLICATIONS

Kaupmees et al, 2011, "Isothermal and two-temperature zone selenization of Mo layers".*
(Continued)

*Primary Examiner* — Tamir Ayad
*Assistant Examiner* — Uyen Tran
(74) *Attorney, Agent, or Firm* — Saliwanchik, Lloyd & Eisenschenk

(57) ABSTRACT

Disclosed are a solar cell and a method of fabricating the same. The solar cell includes a molybdenum layer on a support substrate; an ohmic layer on the molybdenum layer; a light absorbing layer on the ohmic layer; and a front electrode layer on the light absorbing layer, wherein the ohmic layer comprises a first ohmic layer and a second ohmic layer having crystal structures different from each other.

11 Claims, 1 Drawing Sheet

(51) Int. Cl.
  *H01L 31/18* (2006.01)
  *H01L 31/032* (2006.01)
  *H01L 31/0392* (2006.01)
  *H01L 31/0216* (2014.01)

(52) U.S. Cl.
  CPC .... *H01L 31/0322* (2013.01); *H01L 31/03923* (2013.01); *H01L 31/03926* (2013.01); *H01L 31/18* (2013.01); *H01L 31/1884* (2013.01); *Y02E 10/541* (2013.01); *Y02E 10/542* (2013.01)

(56) References Cited

U.S. PATENT DOCUMENTS

| | | |
|---|---|---|
| 2007/0163646 A1 | 7/2007 | Kushiya et al. |
| 2008/0251120 A1 | 10/2008 | Malmstrom et al. |
| 2010/0000589 A1 | 1/2010 | Kiss |
| 2010/0078070 A1* | 4/2010 | Hosoya .................. H01B 1/02 136/256 |
| 2012/0180869 A1 | 7/2012 | Jee et al. |

OTHER PUBLICATIONS

International Search Report in International Application No. PCT/KR2012/010869, filed Dec. 13, 2012.
Office Action dated Oct. 19, 2015 in Chinese Application No. 201280070022.4.
Abou-Ras, D., et al. "Formation and characterisation of MoSe 2 for Cu (In, Ga) Se 2 based solar cells." *Thin Solid Films* 480 (2005): 433-438.

* cited by examiner

SOLAR CELL AND METHOD OF FABRICATING THE SAME

CROSS-REFERENCE TO RELATED APPLICATIONS

This application is the U.S. national stage application of International Patent Application No. PCT/KR2012/010869, filed Dec. 13, 2012, which claims priority to Korean Application No. 10-2011-0137804, filed Dec. 19, 2011, the disclosures of each of which are incorporated herein by reference in their entirety.

TECHNICAL FIELD

The embodiment relates to a solar cell and a method of fabricating the same.

BACKGROUND ART

Solar cells may be defined as devices for converting light energy into electric energy by using a photovoltaic effect of generating electrons when light is incident onto a P-N junction diode. The solar cell may be classified into a silicon solar cell, a compound semiconductor solar cell mainly including a group I-III-VI compound or a group III-V compound, a dye-sensitized solar cell, and an organic solar cell according to materials constituting the junction diode.

A solar cell made from CIGS (CuInGaSe), which is one of group I-III-VI Chal-copyrite-based compound semiconductors, represents superior light absorption, higher photo-electric conversion efficiency with a thin thickness, and superior electro-optic stability, so the CIGS solar cell is spotlighted as a substitute for a conventional silicon solar cell.

In general, a CIGS thin film solar cell is fabricated by sequentially forming a substrate having sodium (Na), a back electrode layer, a light absorbing layer, a buffer layer, and a front electrode layer. In general, the back electrode layer is made of molybdenum (Mo), and heat treatment is performed at a temperature of 450° C. or above in the selenium (Se) atmosphere so that a MoSe2 layer is formed. The MoSe2 layer functions as an electrode, and reduces damage applied to a molybdenum electrode during a patterning process.

DISCLOSURE OF INVENTION

Technical Problem

The embodiment provides a solar cell including an ohmic layer having low electric resistance and superior mechanical strength, and a method of fabricating the same.

Solution to Problem

According to the embodiment, there is provided a solar cell including: a molybdenum layer on a support substrate; an ohmic layer on the molybdenum layer; a light absorbing layer on the ohmic layer; and a front electrode layer on the light absorbing layer, wherein the ohmic layer comprises a first ohmic layer and a second ohmic layer having crystal structures different from each other.

According to the embodiment, there is provided method of fabricating a solar cell, the method including: forming a molybdenum layer on a support substrate; forming an ohmic layer comprising layers having crystal structures different from each other on the molybdenum layer; forming a light absorbing layer on the ohmic layer; and forming a front electrode layer on the light absorbing layer.

Advantageous Effects of Invention

According to the solar cell of the embodiment, the ohmic layer prepared by MoSe2 is provided on the back electrode layer. The ohmic layer may include a crystal surface horizontal to a c axis and having lower contact resistance as well as a crystal surface vertical to a c axis and having superior mechanical strength. Therefore, according to the solar cell of the embodiment, resistance Rs is reduced and a fill factor is increased so that photo-electric conversion efficiency and mechanical strength can be improved.

MODE FOR THE INVENTION

Figure 1:
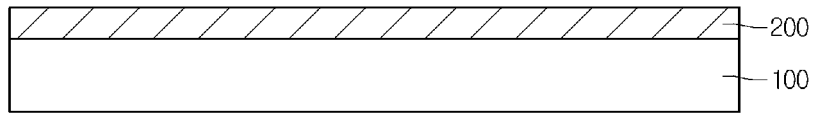
FIG. 1 is a sectional view showing a method of fabricating a solar cell according to the embodiment.

In the description of the embodiments, it will be understood that when a substrate, a layer, a film or an electrode is referred to as being "on" or "under" another substrate, another layer, another film or another electrode, it can be "directly" or "indirectly" on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

Figure 4:
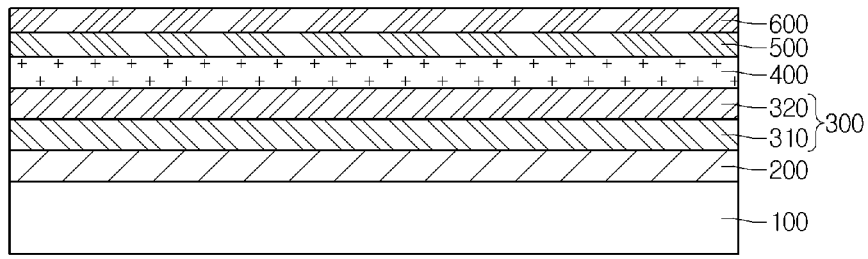
FIG. 4 is a sectional view showing a method of fabricating a solar cell according to the embodiment.
Figure 5:
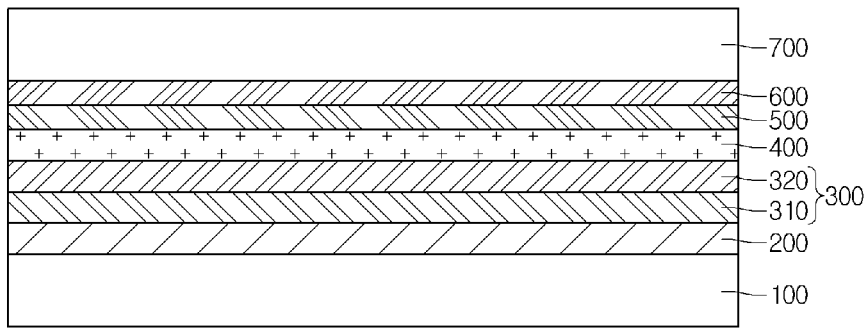
FIG. 5 is a sectional view showing a method of fabricating a solar cell according to the embodiment.

FIGS. 1 and 5 are sectional views showing a method of fabricating a solar cell according to the embodiment. Hereinafter, the solar cell and a method of fabricating the same according to the first embodiment will be described with reference to FIGS. 1 to 5.

Referring to FIG. 1, a back electrode layer 200 is formed on a substrate 100. The support substrate 100 has a plate shape and supports the back electrode layer 200, a light absorbing layer 400, a buffer layer 500, a high-resistance layer 600, and a front electrode layer 700.

The support substrate 100 may include an insulator. The support substrate 100 may include a glass substrate, a plastic substrate, or a metallic substrate. In detail, the support substrate 100 may include a soda lime glass substrate. The support substrate 100 may be transparent. The support substrate 100 may be rigid or flexible.

The back electrode layer 200 may be formed on the substrate 100 through a Physical Vapor Deposition (PVD) scheme or a plating scheme.

The back electrode layer 200 is a conductive layer. The back electrode layer 200 may include at least of molybdenum (Mo), gold (Au), aluminum (Al), chrome (Cr), tungsten (W), and copper (Cu). The back electrode layer 200 may include the Mo. The Mo has a thermal expansion coefficient similar to that of the support substrate 100, so the Mo may improve the adhesive property and prevent the back electrode layer 200 from being delaminated from the substrate 100, and totally satisfying the characteristic required for the back electrode layer 200. That is, it is preferable that the back electrode layer 200 is a Mo layer.

Figure 2:
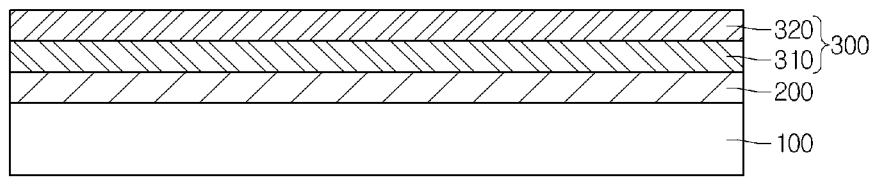
FIG. 2 is a sectional view showing a method of fabricating a solar cell according to the embodiment.

Referring to FIG. 2, an ohmic layer 300 is formed on the Mo layer 200. The ohmic layer 300 may include $MoSe_2$. The ohmic layer 300 may be prepared as a composite layer including a plurality of layers having crystal structures different from each other.

In detail, the ohmic layer 300 may include a first ohmic layer 310 disposed on the support substrate 100 and a second ohmic layer 320 disposed on the first ohmic layer 310. For instance, the first ohmic layer 310 may include a crystal surface horizontal to a c axis of a $MoSe_2$ crystal and the second ohmic layer 320 may include a crystal surface vertical to the c axis of the $MoSe_2$ crystal.

The first ohmic layer 310 serves as a region making direct contact with the Mo layer 200, and contact resistance according to the energy barrier is more important than the mechanical strength. Accordingly, the first ohmic layer 310 according to the embodiment is formed thereon with $MoSe_2$ having a crystal surface, which is horizontal to a c axis and has superior resistance, in adjacent to the Mo layer 200.

Therefore, according to the solar cell of the embodiment, resistance Rs is reduced and a fill factor is increased so that photo-electric conversion efficiency and mechanical strength can be improved.

In addition, the second ohmic layer 310 is a region at which the light absorbing layer 400 is directly formed, and it is important for the second ohmic layer 310 to absorb damage occurring during deposition and patterning processes of layers including the light absorbing layer 400. Thus, the second ohmic layer 320 according to the embodiment includes $MoSe_2$ having a crystal surface, which is vertical to a c axis and has superior mechanical strength. Accordingly, a mechanical strength can be improved in the solar cell according to the embodiment.

The ohmic layer 300 may be formed by selenizing the Mo layer 200. In detail, the ohmic layer 300 may be formed through a selenization process of preparing the light absorbing layer 400. In the method of fabricating the solar cell according to the embodiment, as described above, a plurality of ohmic layers 310 and 320 having crystals different from each other are prepared by varying conditions of the selenization process. This will be described in detail together with a method of preparing the light absorbing layer 400 below.

Figure 3:
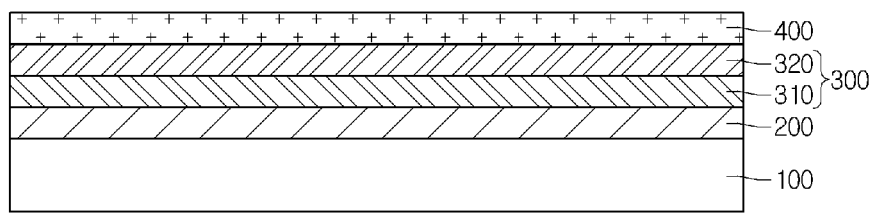
FIG. 3 is a sectional view showing a method of fabricating a solar cell according to the embodiment.

Referring to FIG. 3, the light absorbing layer 400 is disposed on the ohmic layer 300.

The light absorbing layer 400 includes a group I-III-VI compound. For example, the light absorbing layer 300 may have the CIGSS (Cu(IN,Ga)(Se,S)2) crystal structure, the CISS (Cu(IN)(Se,S)2) crystal structure or the CGSS (Cu(Ga)(Se,S)2) crystal structure. The energy bandgap of the light absorbing layer 300 may be in the range of about 1.0 eV to about 1.8 eV.

For example, the light absorbing layer 400 may be formed through various schemes such as a scheme of forming a $Cu(In,Ga)Se_2$ (CIGS) based light absorbing layer 400 by simultaneously or separately evaporating Cu, In, Ga, and Se and a scheme of performing a selenization process after a metallic precursor layer has been formed.

As described above, the ohmic layer 300 according to the embodiment may be formed through the selenization process. The light absorbing layer 400 may be formed through a sputtering scheme or evaporation scheme. Regarding the details of the selenization process after the formation of the metallic precursor layer, the metallic precursor layer is formed on the back electrode layer 200 through a sputtering process employing a Cu target, an In target, or a Ga target. Thereafter, the metallic precursor layer is subject to the selenization process so that the Cu (In, Ga) Se2 (CIGS) based light absorbing layer 400 is formed.

Simultaneously, the ohmic layer 300 may be formed on a part of the back electrode layer 200. In detail, the first ohmic layer 310 and the second ohmic layer 320 may have crystal structures different from each other by varying a temperature condition. For example, the first ohmic layer 310 may be formed by selenizing the Mo layer 200 at a temperature in the range of about 400° C. to about 500° C. and the second ohmic layer 320 may be formed by selenizing the Mo layer 200 at a temperature in the range of about 500° C. to about 600° C., but the embodiment is not limited thereto.

For example, the first ohmic layer 310 may be formed by selenizing the Mo layer 200 at a temperature in the range of about 400° C. to about 500° C. and the second ohmic layer 320 may be formed by selenizing the Mo layer 200 at a temperature in the range of about 500° C. to about 600° C., but the embodiment is not limited thereto.

Referring to FIG. 4, the buffer layer 500 is provided on the light absorbing layer 400. According to the solar cell, the CIGS compound, a P-N junction is formed between the light absorbing player 400 of a CIGS or CIGSS compound thin film, which serves as a P-type semiconductor, and the front electrode layer 700 which is an N-type semiconductor. However, since two materials represent the great difference in the lattice constant and the band-gap energy therebetween, a buffer layer having the intermediate band-gap between the band-gaps of the two materials is required to form the superior junction between the two materials. The buffer layer 500 may have a thickness in the range of about 10 nm to about 30 nm, but the embodiment is not limited thereto.

The buffer layer 500 may include cadmium sulfide (CdS), zinc sulfide (ZnS), InXSY, and InXSeYZn(O, OH). It is preferable that the buffer layer 500 may be zinc sulfide (ZnS).

The high-resistance buffer layer 600 is disposed on the buffer layer 500. The high-resistance buffer layer 600 may include i-ZnO which is zinc oxide not doped with impurities. The high-resistance buffer layer 600 may be formed by depositing zinc oxide on the buffer layer 500 through a sputtering process.

Referring to FIG. 5, the front electrode layer 700 is formed on the high-resistance buffer layer 600. The front electrode layer 700 is transparent conductive layer. For example, the front electrode layer 700 may include B doped zinc oxide (ZnO:B, BZO), Al doped zinc oxide (AZO), or Ga doped zinc oxide (GZO). In detail, the front electrode layer 700 may use Al doped zinc oxide (AZO) or B doped zinc oxide (ZnO:B, BZO) by taking bandgap and contact with the buffer layer 500 into consideration, but the embodiment is not limited thereto.

The front electrode layer 700 may be formed by depositing a transparent conductive material on the high-resistance buffer layer 500. In detail, the front electrode layer 700 may be deposited through a sputtering scheme or a Metal-Organic Chemical Vapor Deposition (MOCVD) scheme. For example, the front electrode layer 700 may be deposited through a sputtering process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
a back electrode layer disposed on a support substrate;
an ohmic layer disposed on the back electrode layer;
a light absorbing layer disposed on the ohmic layer;
a buffer layer disposed on the light absorbing layer; and
a front electrode layer disposed on the buffer layer;
wherein the ohmic layer is disposed between the back electrode layer and the light absorbing layer,
wherein the ohmic layer is formed on at least a part of the back electrode layer,
wherein the ohmic layer comprises an element that corresponds to an element of the back electrode layer;
wherein the element of the back electrode layer, which corresponds to the element of the ohmic layer, comprises molybdenum (Mo);
wherein the ohmic layer comprises a first ohmic layer and a second ohmic layer having crystal structures different from each other,
wherein the second ohmic layer is formed at a temperature higher than that at which the first ohmic layer is formed,
wherein each of the first ohmic layer and the second ohmic layer comprises $MoSe_2$,
wherein an entire crystal surface of the first ohmic layer is perpendicular to a c axis of a $MoSe_2$ crystal,
wherein an entire crystal surface of the second ohmic layer is parallel to a c axis of a $MoSe_2$ crystal,
wherein the ohmic layer is an electrode, and
wherein the light absorption layer has a patterned structure.

2. The solar cell of claim 1, wherein the buffer layer has a thickness in a range of from 10 nm to 30 nm,
wherein the light absorbing layer is a P-type semiconductor layer, and
wherein the front electrode layer is an N-type semiconductor layer.

3. The solar cell of claim 1, wherein the $MoSe_2$ of the first ohmic layer is in direct physical contact with the back electrode layer, and
wherein the $MoSe_2$ of the second ohmic layer is in direct physical contact with the light absorbing layer.

4. The solar cell of claim 1, wherein the back electrode layer is in direct physical contact with the support substrate, and
wherein the second ohmic layer is in direct physical contact with the first ohmic layer.

5. The solar cell of claim 1, wherein the support substrate is a transparent insulating layer.

6. The solar cell of claim 1, wherein the support substrate is rigid.

7. The solar cell of claim 1, wherein the support substrate is flexible.

8. The solar cell of claim 1, wherein an energy bandgap of the light absorbing layer is in a range of 1.0 eV to 1.8 eV.

9. The solar cell of claim 1, wherein the buffer layer has an intermediate band-gap between a band-gap of the light absorbing layer and a band-gap of the front electrode layer.

10. The solar cell of claim 1, wherein the front electrode layer is a transparent conductive layer.

11. The solar cell of claim 1, wherein the buffer layer comprises zinc sulfide.

* * * * *